United States Patent [19]
Kumar et al.

[11] Patent Number: 5,266,891
[45] Date of Patent: Nov. 30, 1993

[54] AUTO SELF TEST OF AC MOTOR SYSTEM
[75] Inventors: Ajith K. Kumar; Thomas D. Stitt, both of Erie, Pa.
[73] Assignee: General Electric Company, Erie, Pa.
[21] Appl. No.: 630,681
[22] Filed: Dec. 20, 1990
[51] Int. Cl.[5] ............................................. G08B 21/00
[52] U.S. Cl. ...................... 324/158 SC; 324/158 MG
[58] Field of Search ............... 324/158 MG, 158 SY, 324/158 SC, 537, 119, 110; 318/490; 322/99; 340/648, 645; 363/58, 98

[56] References Cited
U.S. PATENT DOCUMENTS

| | | | |
|---|---|---|---|
| 3,852,656 | 12/1974 | Bourbeau | 363/58 |
| 4,384,248 | 5/1983 | Matsuda et al. | 324/537 |
| 4,633,241 | 12/1986 | Casteel et al. | 324/158 SC |
| 4,675,799 | 6/1987 | Suzuki et al. | 363/58 |
| 4,843,533 | 6/1989 | Roof et al. | 363/58 |
| 4,908,756 | 3/1990 | Higashino | 368/58 |
| 4,926,306 | 5/1990 | Ueda et al. | 363/58 |
| 4,953,069 | 8/1990 | Braun et al. | 363/58 |

OTHER PUBLICATIONS
"SC 30000 1.5 Micron Standard Cells"; RCA Solid State 1987; pp. 1-225.

Primary Examiner—Vinh Nguyen
Attorney, Agent, or Firm—R. Thomas Payne

[57] ABSTRACT

Apparatus and method for auto-self testing of a power converter and motor system wherein the power converter has three parallel legs, each including two series connected gate-turn-off thyristors (GTO) connected between a pair of DC power source buses. A microprocessor controls the test sequence in which each GTO is individually turned on in a predetermined order so as to create a transient snubber current through the motor and through each GTO when it is turned on. The snubber current and a voltage in each leg is measured and compared to a respective reference to detect wiring errors, and defects in the motor, the GTOs, and other system components. Error messages are generated in response to detection of abnormalities or defects.

20 Claims, 9 Drawing Sheets

AUTO SELF TEST OF AC MOTOR SYSTEM

BACKGROUND OF THE INVENTION

This invention relates generally to apparatus and method for testing AC motor power systems and more particularly apparatus and method for nondestructive in-circuit auto self testing of an AC motor system including inverter power circuit, its drive circuits and the load motor.

It is common in AC electric motor drive systems to employ power inverter systems to furnish electric power from a DC source to the AC motor. These inverters are of various types, but are often comprised of gate turn-off thyristors (GTO) in a bridge arrangement. The GTOs in the bridge are selectively gated to control the electrical power supplied to the motor by converting the DC power into AC power which drives the motor. Typically, two GTOs are connected in a series arrangement in what is commonly referred to as a "leg" between the two sides of the DC source. A common converter of this type is a three-phase converter having three legs connected in mutual parallel between the positive and negative DC source lines. The GTOs of each of the legs are rendered conductive in a predetermined order or sequence in order to control the electrical power delivered from the DC busses to the motor load.

These motor system require require regular maintenance to avoid or detect a variety of common failure modes. For example, if both GTOs of a leg were to become conductive simultaneously, there would exist a short between two of the DC source lines which, if allowed to continue, could result in great damage to the load, power source, and/or to the GTOs. In addition, failure of various components and segments of the system such as the feedback circuits, drive circuits, and the motor load itself can occur. In prior art, expensive and time consuming manual off-line testing has been necessary to detect many errors at an early enough stage to ensure proper operation. In order to enhance maintenance of such systems, it would accordingly be highly desirable to provide an auto self test capability. However, in the prior art, self testing has been largely limited to testing the failure of the GTOs and detection of certain abnormalities in drive port wave form.

It is accordingly an object of the present invention to provide a novel method and apparatus for auto self testing of the AC motor system which provides for testing and detection of a wide variety of abnormalities and failures.

It is another object of the invention to provide a novel method and apparatus for auto self testing that provides nondestructive incircuit testing of an AC motor drive system including testing the motor coils without the risk of rotating the motor during the test.

It is yet another object of the invention to provide a novel method and apparatus for auto self testing of an AC motor drive system which utilizes the motor load inductance and circuit snubber capacitance to permit comprehensive testing.

Briefly, the foregoing and other objects of the invention are achieved in accordance with the present invention by testing a power converter and motor system wherein the power converter has a plurality of legs having first and second series connected control turn-off devices, such as GTOs, each having a control electrode. The testing method includes selectively generating control signals and coupling them to the control electrode of each control turn-off device to render each device conductive, one at a time, such that a transient current flows through the motor and the respective conductive control turn-off device. The transient current is measured and then compared to a reference to detect defects in the motor and power converter.

The invention may further provide for testing the generation of the control signals by detecting the state of the control signals being coupled to the control electrode and verifying that they are identical to the control signal generated. In addition, the state of the control turn-off devices may be monitored and then compared to the control signals to detect failure of a control turn-off device to respond to the control signal. A voltage measurement may also be made in each leg of the power converter a selected time period after transient current is measured and the voltage compared to a reference to detect additional defects. This test process may be controlled by a programmed processor to provide a programmed auto self test of the motor system.

BRIEF DESCRIPTION OF THE DRAWINGS

The invention, together with further objects and advantages thereof may be understood by reference to the following description taken in conjunction with the accompanying drawings.

DETAILED DESCRIPTION

Figure 1:
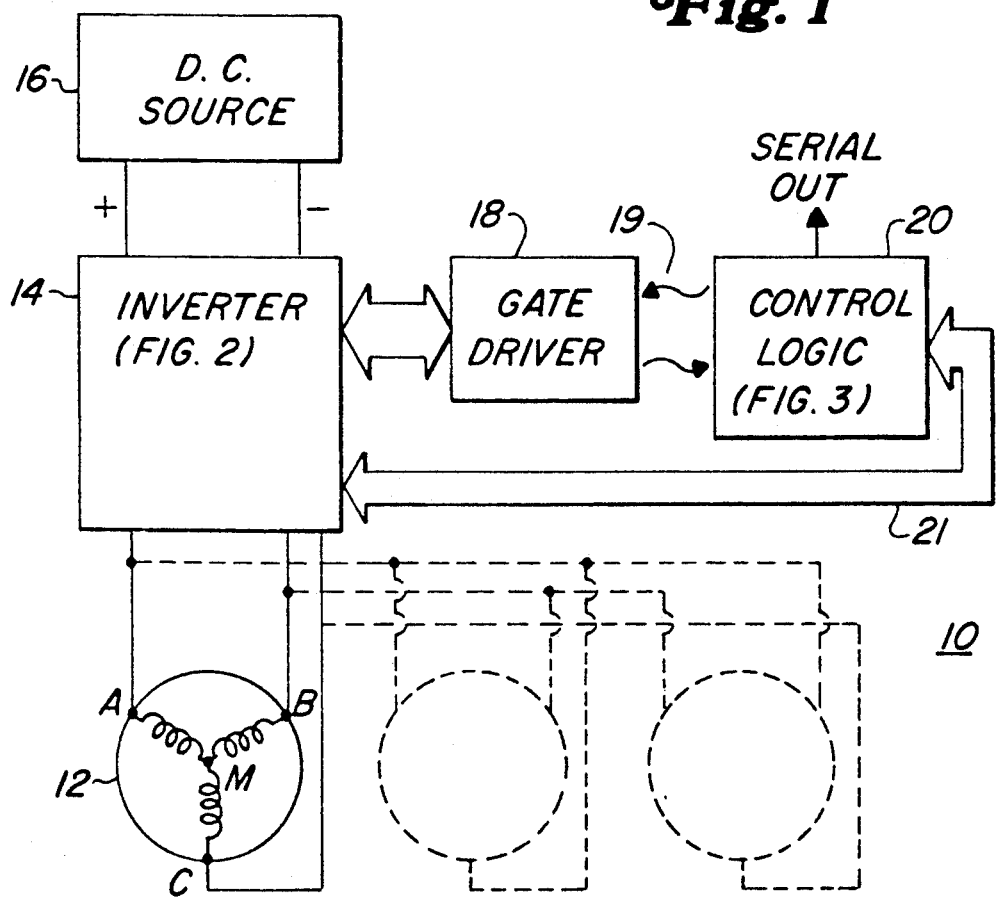
FIG. 1 is a generalized block diagram illustrating an AC motor drive system in accordance with the invention.

FIG. 1 is a block diagram of a specific embodiment of a three-phase, voltage source inverter driven motor system 10 in accordance with the invention. System 10 comprises three-phase motors 12 driven by a three-phase voltage source inverter 14 supplied by a DC source 16 (e.g., 600 volt DC). The invention is applicable to a wide range of power converter-load configurations, for example, single phase converter and single phase motor; multiple motors in parallel driven by a single converter; transformer loads; and other inductive or resistive loads. Coupled to the inverter 14 is a gate driver module 18 which is controlled by a control logic 20, as shown. In operation the inverter 14 converts the DC source 16 into a three-phase drive voltage to drive the motors 12 under the control of the gate driver module 18. The gate driver module 18 controls the switching of the inverter switching devices (i.e., GTOs) and the gate driver module 18 is controlled by the control logic 20 via an optical control link 19. In addition, feedback status signals from the GTO devices of the inverter 14 are coupled back to the gate driver module 18 and through to the control logic 20 via the optical link 19. Additional signals from current and voltage sensors of the inverter 14 are coupled to the control logic 20 via a bus 21, as shown. The control logic using the feedback values from the optical link 19 and the sensed current and voltage values via the bus 21 performs the auto self test method in accordance with the invention. In a typical application, such as a commuter rail car, the inverter 14 may be configured to drive two motors in parallel, and may be arranged in pairs coupled to a single control circuit to drive a total of four motors.

Figure 2:
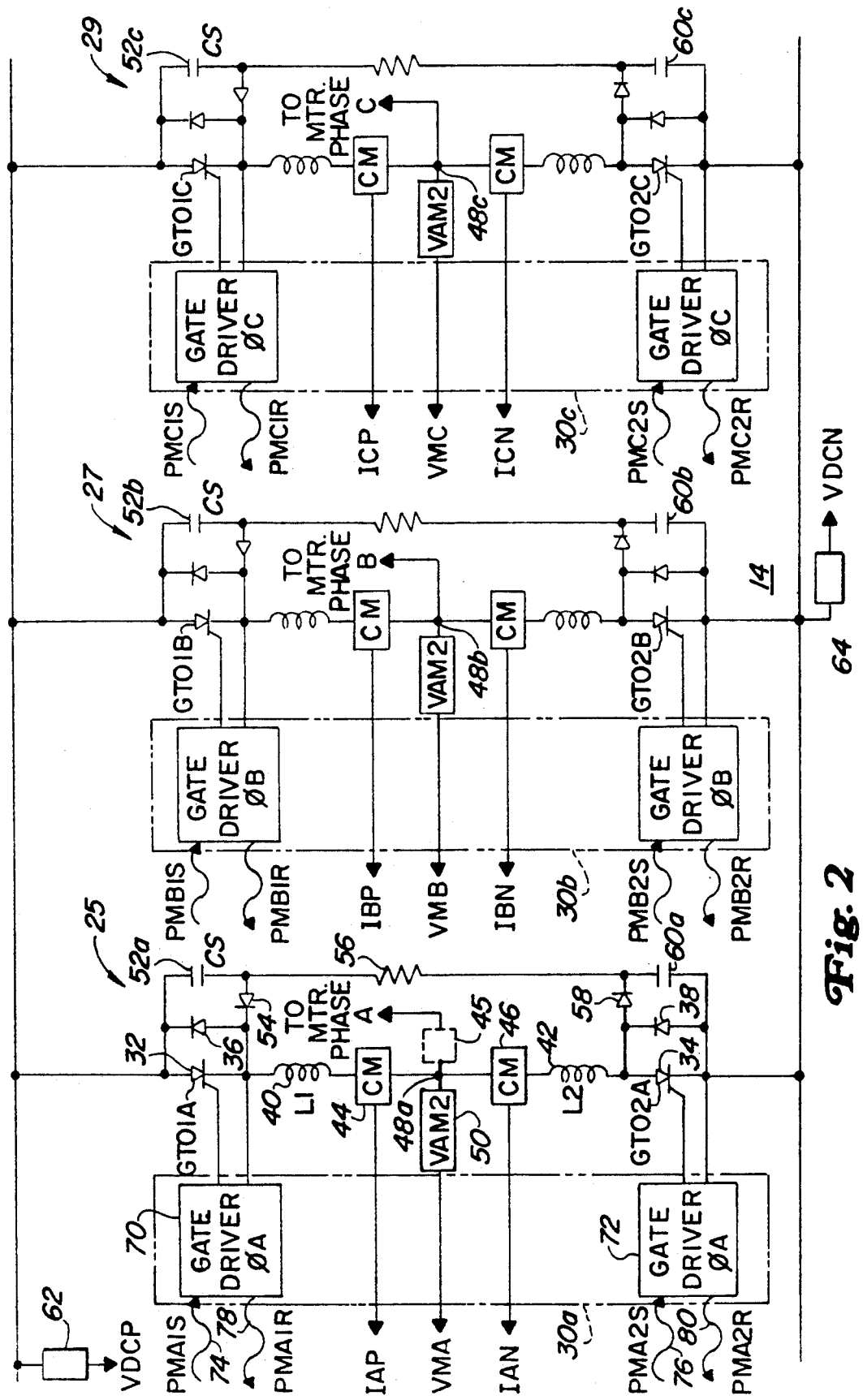
FIG. 2 is a detailed block diagram of the power inverter circuit shown in FIG. 1.

Referring now to FIG. 2, there is shown a detailed schematic diagram of a three-phase inverter 14 in accordance with the invention including gate driver circuits 30a, 30b, and 30c, as shown. Such gate drivers are described in detail in a co-pending patent application entitled "Gate Turn-off Thyristor Control Circuit with Shorted Gate Detector" filed by R. B. Bailey and H. J. Brown on Sep. 18, 1990 bearing Ser. No. 07/584,541 and assigned to General Electric Company which is hereby incorporated by reference. The inverter 14 comprises a first leg 25 (phase A) with an upper GTO 32 and a lower GTO 34 arranged in series with the anode of the upper GTO 32 coupled to the positive DC source line and the cathode of the lower GTO 34 coupled to the negative DC source line. The GTOs 32, 34 may typically be mounted on a heat sink with a temperature sensing thermal resistor mounted thereon to detect overheating.

For each GTO 32, 34, there is a respective anti-parallel diode 36, 38 connected from anode to cathode to provide a return path for inductive load currents. An upper inductor (L1) 40 (i.e., 5 $\mu$h) and lower inductor (L2) 42 are coupled in series with the GTOs 32, 34. Also in series with the inductors L1, L2 are an upper current measurement circuit 44 (e.g., a Model LT1000-FI/SP45 Manufactured by LEM of Switzerland) and a lower current measurement circuit 46 which are connected at a Phase A node 48, as shown. The node 48 is coupled to one phase (phase A) of the three-phase motor (or motors) 12 and, as shown, to a conventional high impedance voltage measurement circuit 50. The current measurement circuits 44, 46 thus generate current measurement signals IAP and IAN to be coupled to the control logic 20. The current measurement circuits may alternately be implemented with a single current measurement circuit 45 coupled in series between the node 48 and the motor phase A. The voltage measurement circuit 50 generates a voltage measurement signal $V_{ma}$ which is coupled to the control logic 20.

A snubber circuit is also coupled to the phase A leg 25 comprising a capacitor 52a and diode 54 coupled across the GTO 32 and a capacitor 60a (e.g., 3 $\mu$f) and diode 58 coupled across the GTO 34, as shown. A resistor 56 (e.g., 25 ohms) provides a discharge pass for the snubber capacitors 52, 60. Conventional high impedance voltage measurement circuits 62, 64 are coupled respectively to the positive DC voltage source line and negative DC voltage source line to provide a positive voltage source measurement signal VDCP and a negative voltage source measurement signal VDCN.

The gate driver circuit 30a comprises an upper gate driver 70 and a lower gate driver 72, each of which is coupled to the gate and cathode of the respective GTO 32, 34, as shown. The gate drivers 70, 72 provide drive signals to the gates of the GTOs 32, 34 to turn them on and off at the proper time. The gate drivers 70, 72 also detect whether the GTO actually did turn on or off in response to the signal (i.e., gate status feedback). In addition, each gate driver 70, 72 is coupled to the control logic 20 via conventional optical couplers to permit input of gate command signals (PMA1S, PMA2S) from the control logic 20 on respective input channels 74, 76, and to send gate status feedback signals (PMA1R, PMA2R), indicating whether the GTO is turned on or off, back to the control logic 20 on respective transmit channels 78, 80.

The inverter power circuit 14 of FIG. 2 further comprises two additional legs 27, 29 (i.e., phase B, phase C), which are substantially identical to phase A leg 25, as shown. The phase B leg 27 is connected to the AC motor phase B and the phase C leg 29 is connected to the AC motor phase C while the input and output optical lines and measurement signals are coupled to the control logic 20 as described with regard to the phase A leg 25.

Figure 3:
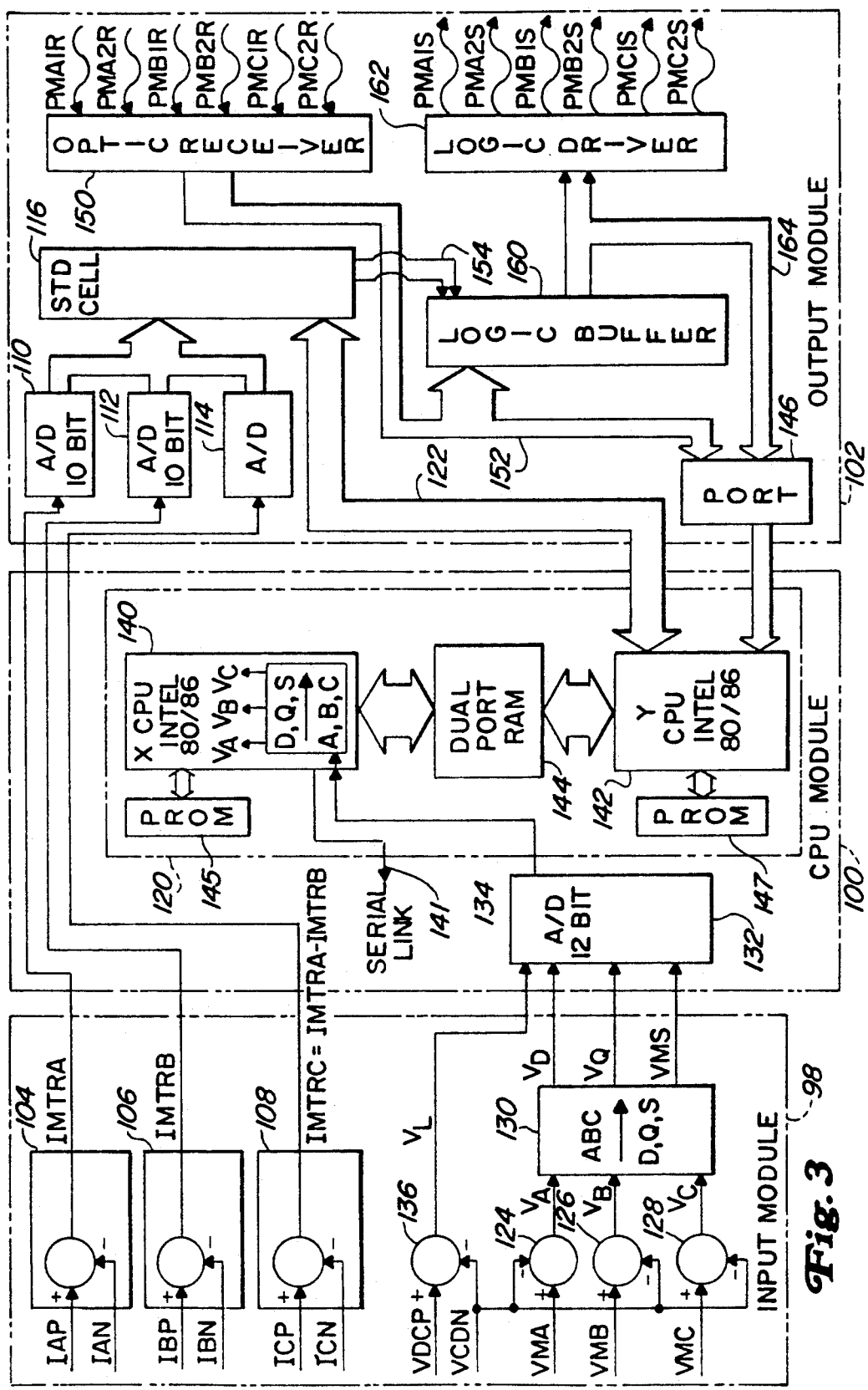
FIG. 3 is a detailed block diagram of the control logic shown in FIG. 1.

FIG. 3 is a detailed block diagram of the control logic 20 of FIG. 1, and comprises three main blocks: an input module 98, a processor module 100 and an output module 102. A detailed description of such a control logic circuit is provided in co-pending application entitled "Inverter Control Method and Apparatus" filed by A. K. Kumar and T. D. Stitt on Nov. 27, 1990 bearing Ser. No. 07/618,787 and assigned to General Electric Company, which is hereby incorporated by reference. The input module comprises a conventional summing circuit 104 for phase A, a conventional summing circuit 106 for phase B, and an optional conventional summing circuit 108 for Phase C, each of which combines the respective upper and lower current measurement value to obtain a motor phase current value for the corresponding phase (i.e., IMTRA, IMTRB, IMTRC). Since IMTRC can be derived as the sum of the currents of phases A and B, summing circuit 108 is optional. In addition, if the optional single current measurement circuit 45 in the inverter 14 of FIG. 2 is used for each phase, no summing circuits are needed. In each case, the motor phase current value is coupled from the input module 98 to analog to digital (A/D) converters 110, 112 (e.g., high speed, 10 bit A/D converter such as model ADC856 manufactured and marketed by Datel of Mansfield, Mass.) and optionally, to an A/D converter 114 in the output module 102. The A/D converters 110, 112, 114 convert the motor phase current values to digital form and couple them through a standard cell 116 to a processor 120 via a bus 122, as shown. Alternatively, the digitized signals can be coupled directly to the processor 120 from the A/D converters.

The input module also couples the voltage measurement values $V_{ma}$, $V_{mb}$, $V_{mc}$ from the inverter 14 to respective summing circuits 124, 126, 128, along with the negative DC source voltage measurement signal VDCM, as shown. These summing circuits thus provide voltage measurement values ($V_A$, $V_B$, $V_C$) referenced to negative DC source line which are coupled to a converter circuit 130. The converter circuit 130 converts the signals from three-phase signals ($V_A$, $V_B$, $V_C$) to two-phase signals ($V_D$, $V_Q$, $V_{MS}$) which are coupled to an A/D converter 132 (e.g., a high speed, 12 bit A/D converter, model ADC80, manufactured by Analog Devices located in Norwood, Mass.) of the processor module 100, as shown. Alternatively, $V_A$, $V_B$, $V_C$ values may be coupled directly to the A/D converter 132. The A/D converter 132 converts the input values of $V_A$, $V_B$, and $V_C$ to digital form and couples the digitized values to a processor 120 via a bus 134. The positive DC voltage source measurement value VDCP from the inverter 14 is also coupled to the input module 98 and is coupled to a summing circuit 136 along with the negative DC voltage source value VDCM. The summing circuit 136 generates a voltage difference signal $V_L$, representing the actual voltage source line voltage, which is also coupled to the A/D converter 132. The A/D converter 132 digitizes the value of $V_L$ and couples the digitized value to the processor 120, as shown.

The processor 120 of the processor module 100 may be a single microprocessor (e.g., a model 80960CA such as that manufactured by Intel of Santa Clara, Calif.) or it may be a dual processor structure, such as illustrated, comprising an X processor 140 and a Y processor 142 (e.g., an Intel 80186 manufactured and marketed by Intel Corporation of Santa Clara, Calif.) both coupled to a dual port random access memory (RAM) 144 (e.g., models IDT7130 and IDT 7140 such as manufactured by Integrated Devices Technology of Santa Clara, Calif.). The processor 120 outputs signals via the bus 122 to the standard cell 116 of the output module 102 and communicates with external devices such as an external processor or a display (e.g. for error messages, etc.) via a serial link 141. In addition, inputs from a port 146 are coupled to the processor 120 from the output card 102. The processor 120 is controlled by a program stored in each PROM 145, 147 to process the input values from both the output module 102 and the input module 98 and generate output control signals coupled on the bus 122 to the standard cell 116 to control the auto self test of the inverter-controlled motor system 10 in accordance with the invention.

The output module 102 includes a conventional optical receiver circuit 150 (e.g., model HFBR2522, manufactured and marketed by Hewlett Packard of Palo Alto, Calif.) which receives the optical GTO status feedback signals (PMA1R, etc.) from the inverter driver module 18, and couples them in electrical form to a logic buffer circuit 160 via a bus 152. These signals are also coupled to the processor 120 via the port 146, as shown. In addition, gate firing pulses from the standard cell 116 are coupled to the logic buffer circuit 160 via a bus 154. The logic circuit 160 couples gate pulses (i.e., gate "on" or "off" command signals) to an optical driver 162 (e.g., model HFBR1521, marketed and manufactured by Hewlett Packard of Palo Alto, Calif.) which generates optical gate command signals (PMA1S, etc.) which are coupled via the optical channel to the inverter 14. In addition, the gate command signals from the logic buffer circuit 160 are coupled via a bus 164 to the processor 120 via the port 146, as shown.

In normal operation, the control logic circuit 20 generates gate command signals which are coupled to the gate driver module 18. The microprocessor 120 of the module 100 controls generation of gate firing pulses by providing gate firing control signals to the standard cell 116 via the bus 122. The standard cell 116 generates gate firing control pulses in response to the gate firing control signals from the microprocessor 120. These gate firing control pulses are coupled to the logic buffer 160 via the bus 164 which couples gate command signals to the optical driver 162 for transmission to the gate driver module 18. The GTOs of the inverter 14 are then turned on and off by the gate driver module 18 at the appropriate times under the control of the gate command signals. Additionally, gate status feedback signals received from the optical receiver 150 are coupled to the logic buffer 160 which utilizes them to determine if the GTOs actually switched, as commanded, in order to prevent unwanted conditions such as having both upper and lower GTOs turned on at the same time.

During the auto self test, the motors are stopped and the GTOs are turned on and off under control of the processor 120 using the method according to the invention. The processor then analyzes the voltages and currents measured during the test sequence and generates appropriate error messages if an abnormality is detected.

Figure 4A:
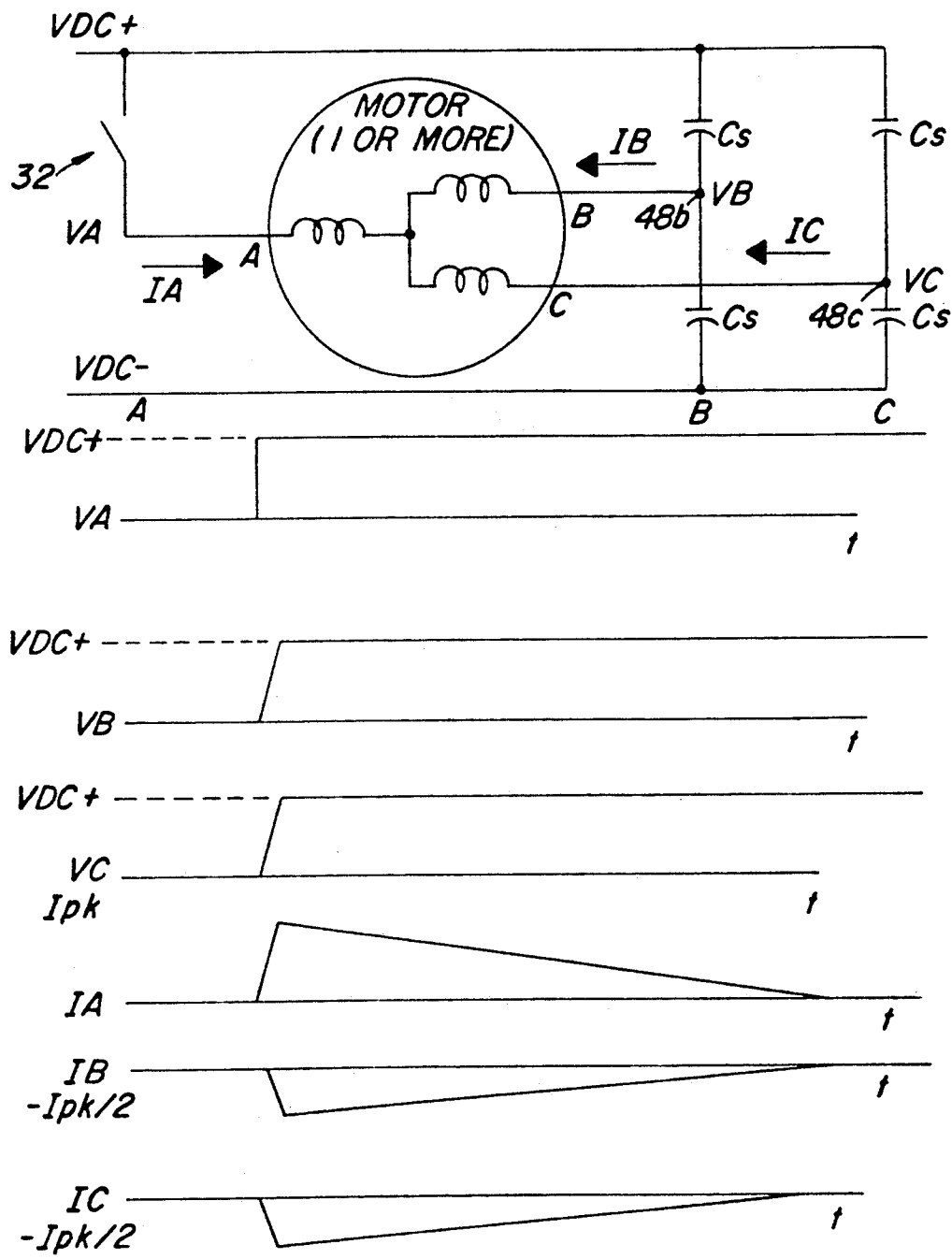
FIGS. 4A and 4B are diagrammatic illustrations of the inverter circuit operation and time dependent plots of voltage and current during testing according to the invention.
Figure 4B:
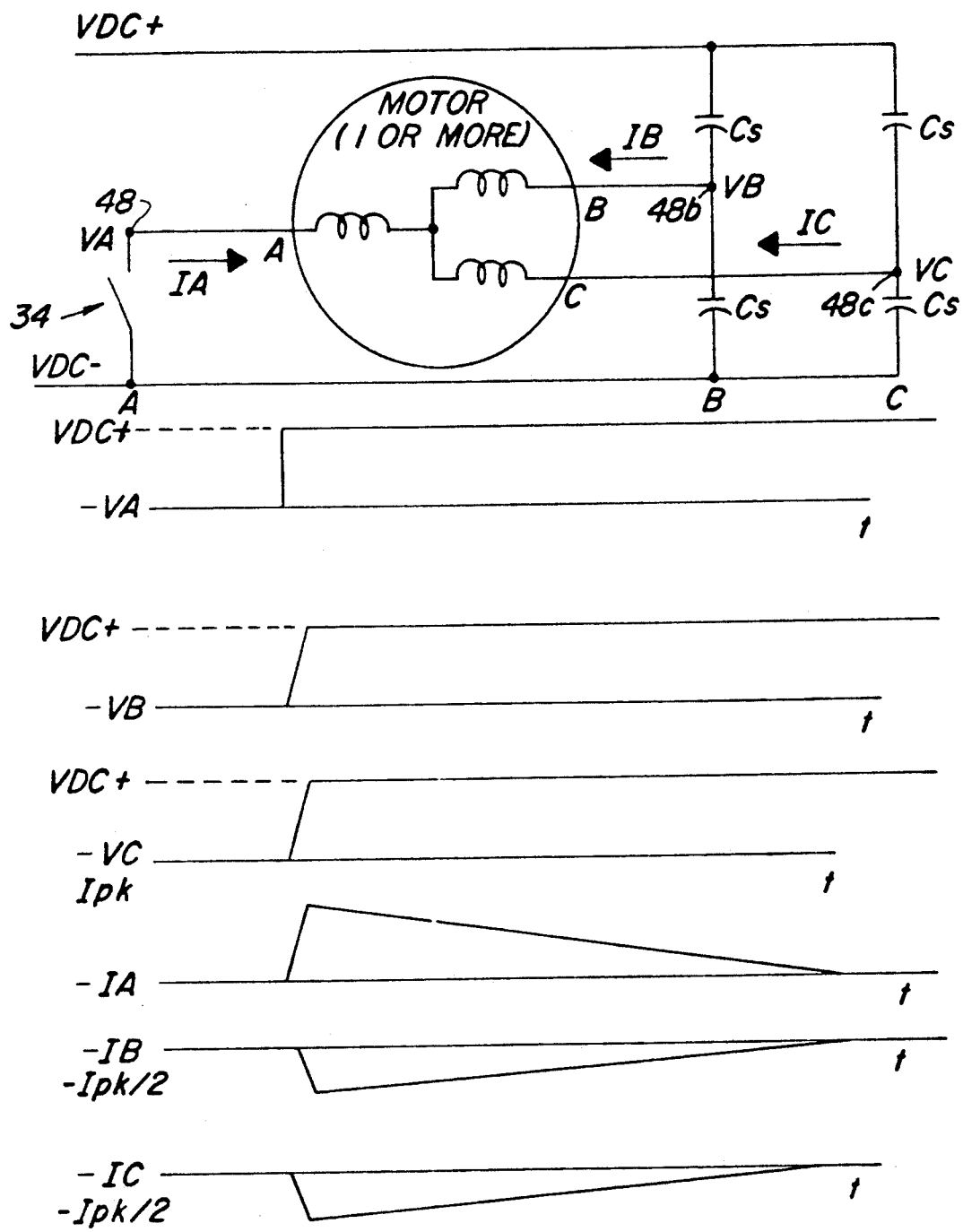

FIGS. 5A-5D are detailed block diagrams illustrating a specific embodiment of a program logic for the microprocessor 120 and the methodology of the auto test according to the invention. FIGS. 4A-4B illustrate the operation of the inverter tests and the associated voltages on current versus time plots, and may be referred to in conjunction with FIGS. 5A-5D to appreciate the invention.

Figure 5A:
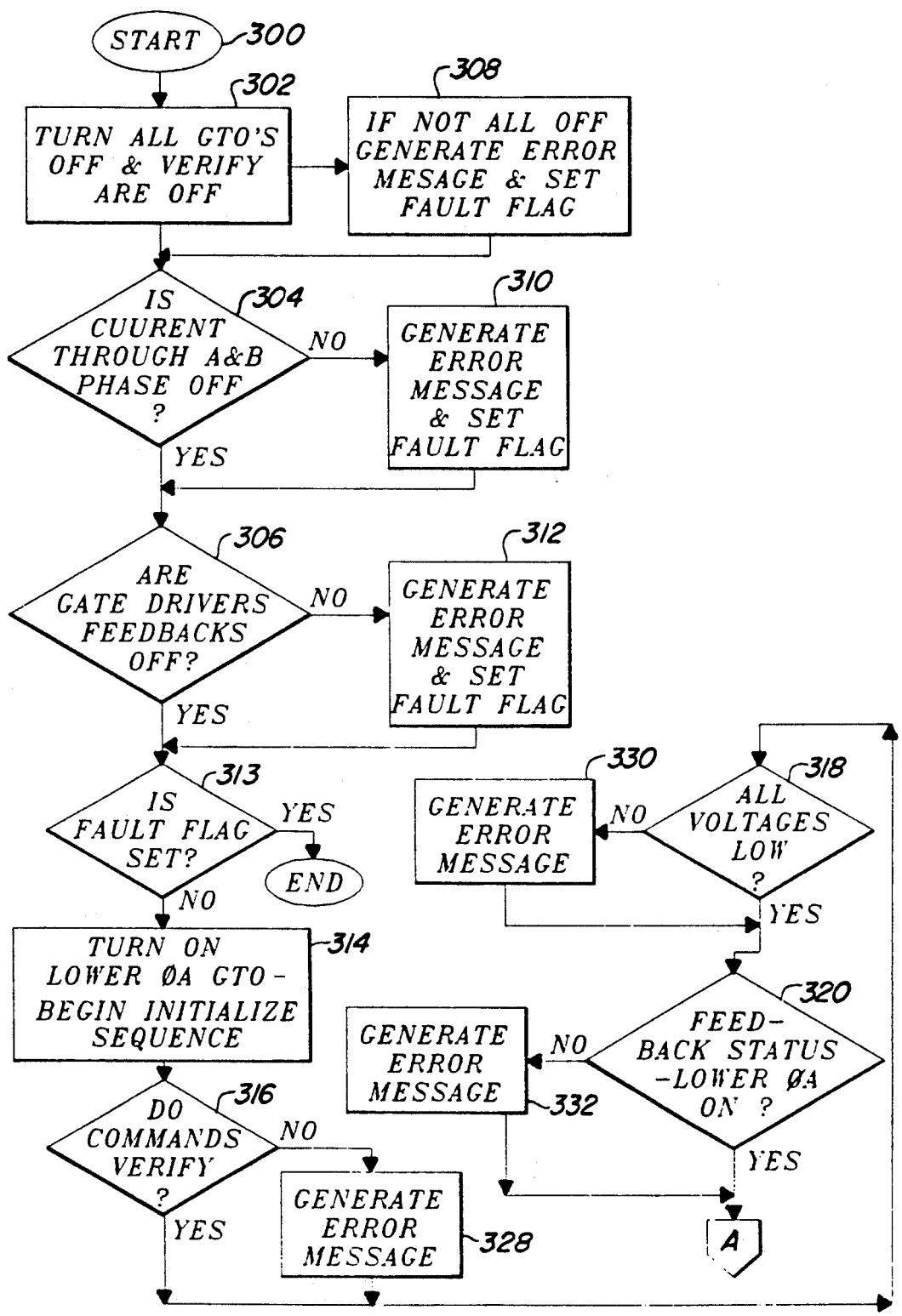
FIGS. 5A to 5D are detailed flow diagrams illustrating the methodology and structural flow of a specific embodiment of an auto test routine according to the invention.
Figure 5B:
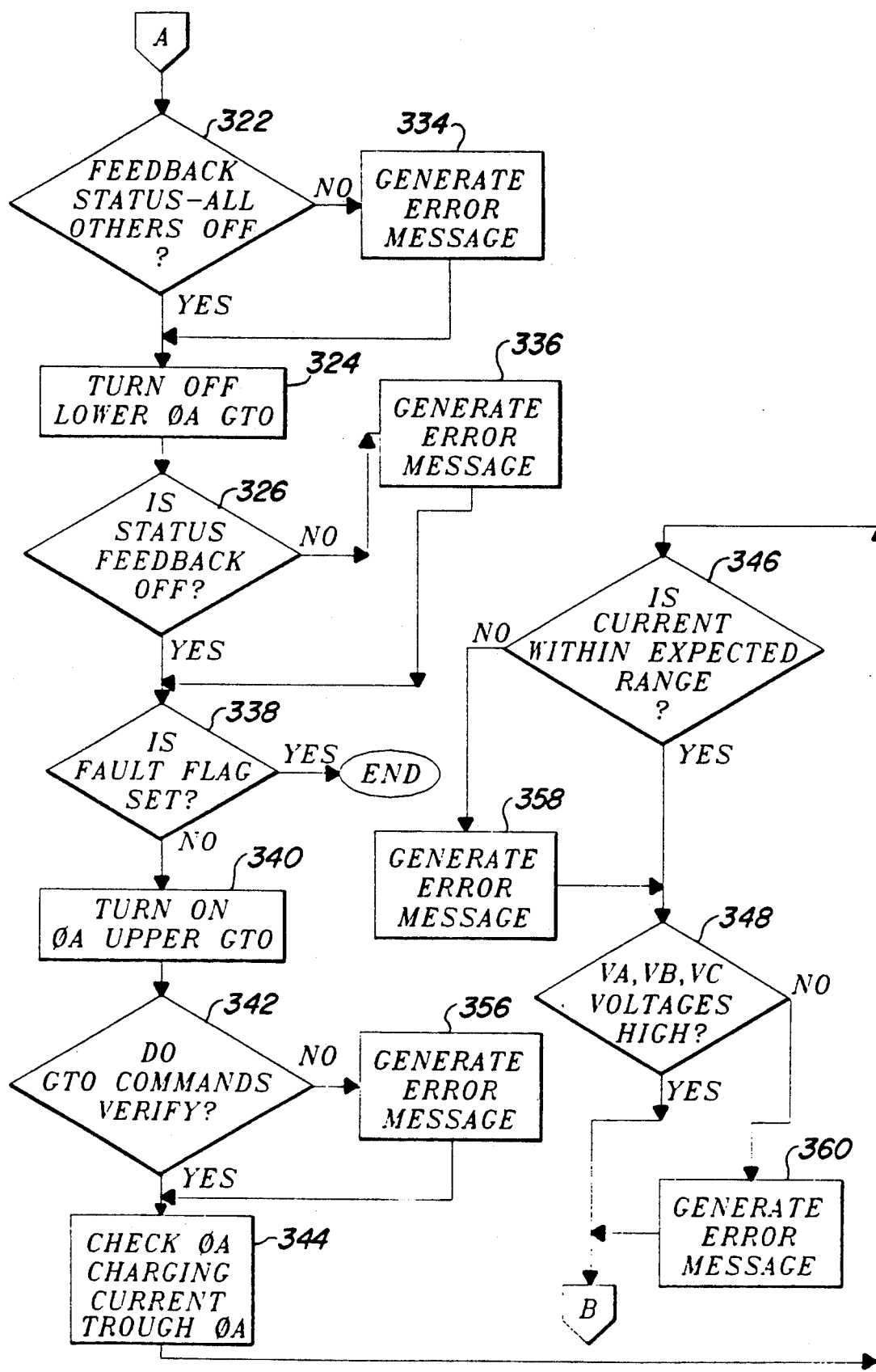
Figure 5C:
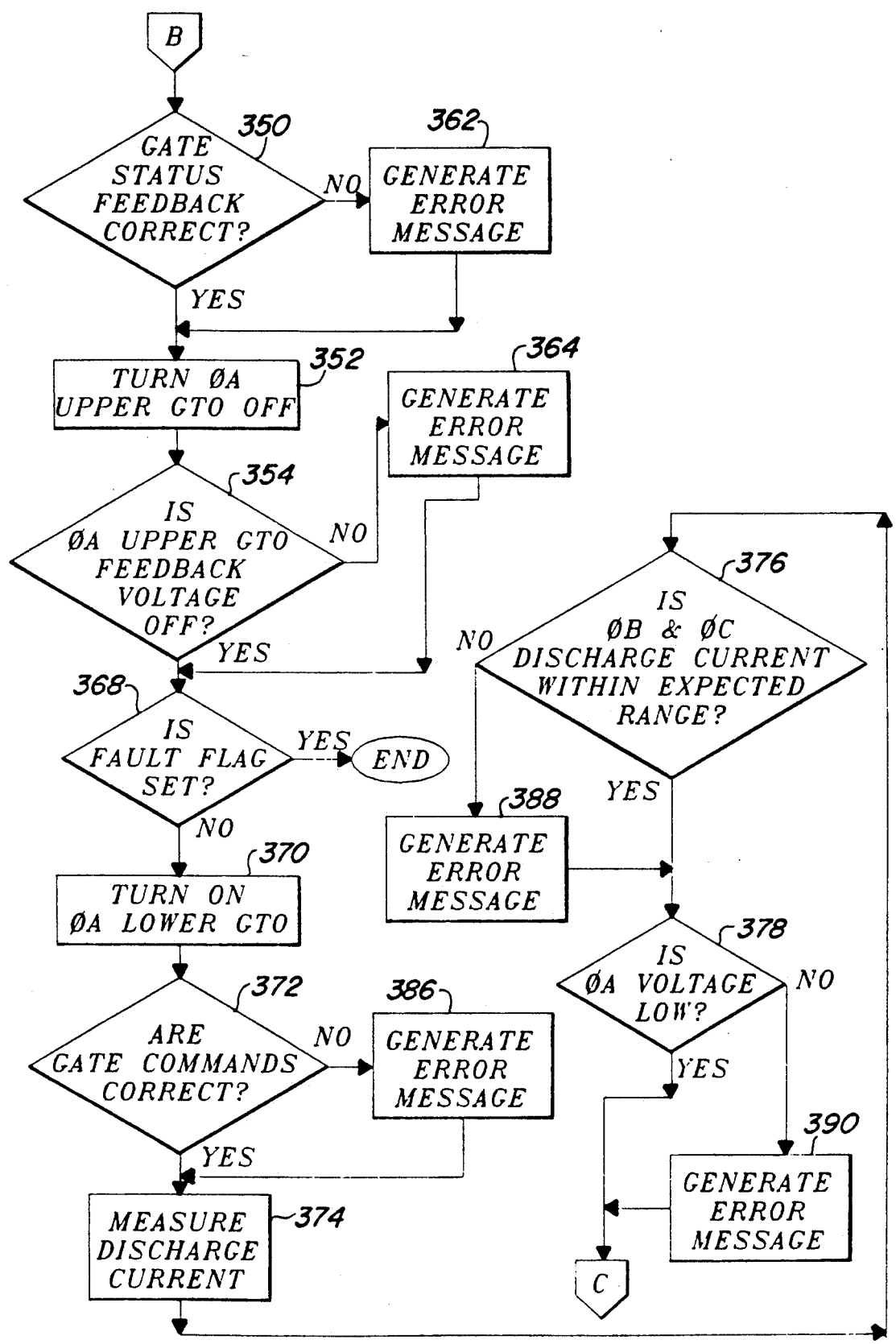
Figure 5D:
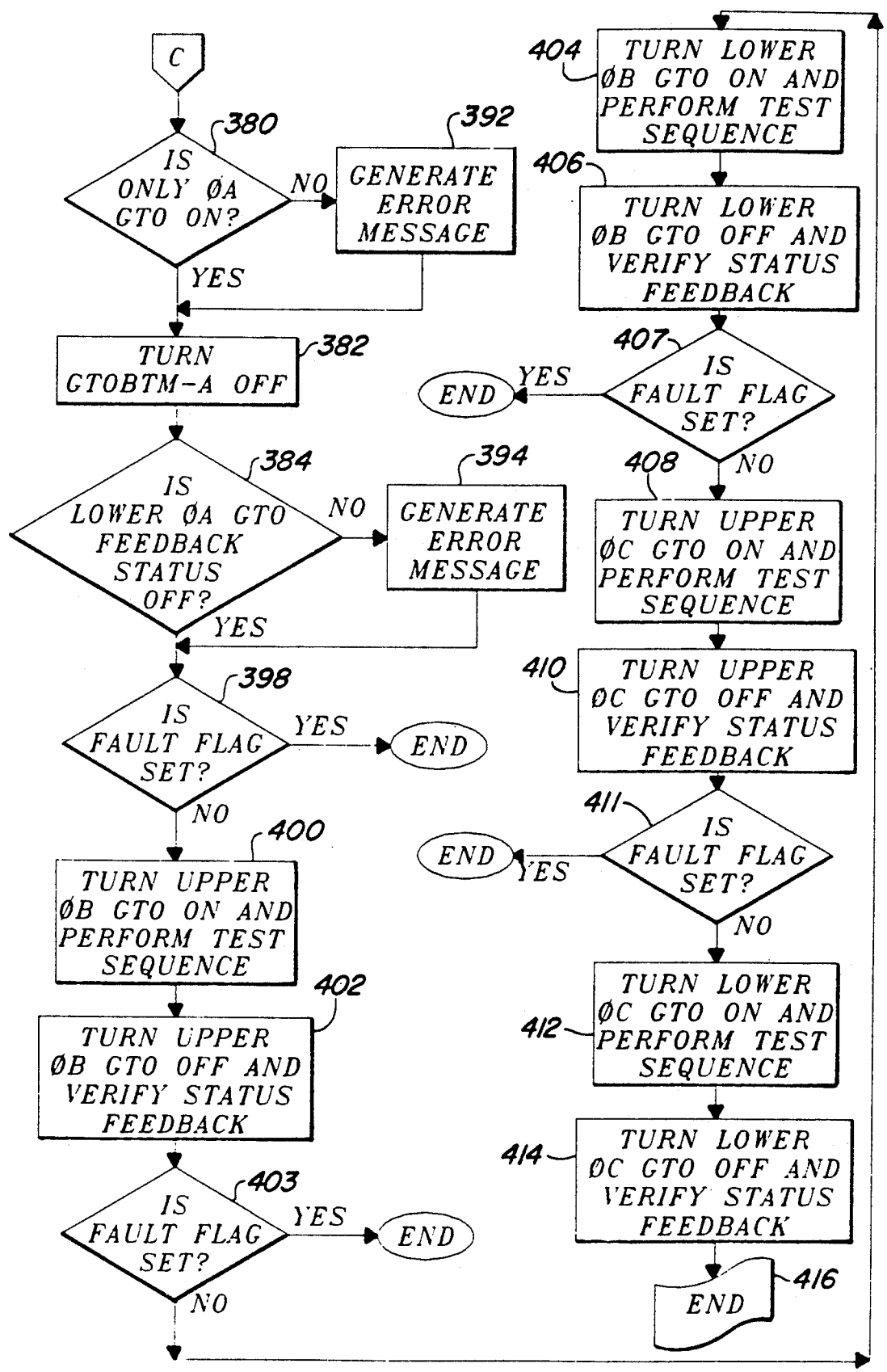

Referring to FIG. 5A, the test routine is entered at block 300, as shown, and begins with the turnoff of all GTOs, as illustrated by block 302. Off commands are sent to all six GTOs (See FIG. 2) and those commands are verified to be off by checking the gate command signals which are output from the logic buffer 160 and fed back to the processor 120 via the port 146, as shown at FIG. 3. The currents through both phase A and B are then checked after a short delay (e.g., 1 millisecond) to determine if they are zero, as illustrated by block 304. The current check is performed by checking the values of IMTRA, and IMTRB which have been digitized in the A/D converters 110, 112, and coupled to the processor 120. A small delay (e.g., 100 microseconds) after the current check, the gate status feedback signals coupled through the optical receiver 150 are checked to verify that all GTOs are off.

If any of the tests at blocks 302, 304 or 306 result in detection of an abnormality, an error message is generated, the fault flag is set and the test proceeds normally, as illustrated by blocks 308, 310 and 312. The error message is passed from the processor 120 to an external display or other output device via the serial link 141. If a fault occurs, the test sequence will continue normally for that GTO sequence. However, all subsequent test sequences of other GTO's will not be performed. Thus, at block 313, the fault flag is checked and if set, processing control branches to the end of the test routine skipping all subsequent test sequences. If the fault flag is not set, processing continues to block 314 as shown.

An initializing sequence to initialize the inverter circuit 14 for the auto self test begins if no fault was detected with the turn-on of the lower A phase GTO 34 by generation of a turn-on command for the A phase GTO, as illustrated by block 314. The on command and the off commands for all other GTOs are verified, as illustrated by block 316, by checking the output command signals to the optical drive 162. This turn-on of the lower A phase GTO results in the voltages $V_A$, $V_B$, and $V_C$ (i.e., the voltages at nodes 48, 48b, and 48c) dropping to zero by means of discharge of the snubber capacitors 60b and 60c through the phase B and phase C and then through phase A motor coils to the DC source line through the turn-on GTO 34. The node voltages $V_A$, $V_B$, and $V_C$ are then checked by the processor and verified to be low (i.e., approximately zero) after allowing enough time to permit discharge of the snubber capacitors 60b and 60c and the charging of the snubber capacitors 52a, 52b and 52c, as shown by block 318. The gate status feedback signal for the lower A phase GTO 34 is then checked to determine if it is on and all other gate status feedback signals are checked to determine if they are off, as illustrated by blocks 320 and 322 (see FIG. 5B). The lower A phase GTO 34 is then turned off (i.e., an off command is generated) as illustrated by block 324 of FIG. 5B and its gate status feedback signal is checked to verify that the GTO 34 is off as shown by block 326. If any of the tests at blocks 316, 318, 320, 322, or 326 are negative, an error message is generated, the fault flag is set, and the test sequence then proceeds to the next step, as illustrated by blocks 328, 330, 332, 334, and 336. Processing continues normally until the next fault flag text at block 338 where processing control branches to the end if the fault flag is set.

The main test sequence of the auto self test routine begins at block 340, if no fault was detected, with turn-on of the upper A phase GTO 32. The phase A, B, and C nodes 48, 48b, 48c were made zero volts by turning on the lower A phase GTO 34 during initialization (see block 314). Referring to FIG. 4A, when the A phase upper GTO 32 is turned on, the A phase voltage $V_A$ is pulled to the DC positive line voltage and the snubber current through the phase B and phase C snubber capacitors flows through the phase A mode 48 as the phase B and phase C voltages $V_B$ and $V_C$ charge up to the DC positive line voltage. This results in the voltage versus time plots illustrated in FIG. 4A for $V_A$, $V_B$, and $V_C$ and current versus time plots for $I_A$, $I_B$, and $I_C$. After the on command is generated for the upper A phase GTO 32, the on command signals and all the other GTO off command signals are checked to determine if they are correct, as illustrated by block 342. The transient current through phase A is then checked as illustrated by block 344 by rapidly sampling it during a period from zero to 300 microseconds after the command is generated, and obtaining the peak transient current value ($I_{pk}$). The peak current may also be obtained by waiting a predetermined time after the on command is generated and measuring the current at that time to obtain a peak current. The peak current obtained is compared to a reference value to determine if it is substantially equal to the reference value, as shown by block 346. In one embodiment, the reference value is given by the relationship $V_L \cdot (C/L)^{\frac{1}{2}}$ where $V_L$ is the line voltage (e.g., DC+), C is the equivalent capacitance of the total circuit snubber capacitance, and L is the equivalent motor inductance. The phase A, B and C voltages ($V_A$, $V_B$, $V_C$) are then verified to be high (i.e., near the positive DC source line voltage) as illustrated by block 348. The gate status feedback signals are then checked to determine if the upper A phase GTO 32 is turned on and if all the other GTOs are off as shown by block 350 (see FIG. 5C). The upper A phase GTO 32 is then turned off by generating an off command signal as illustrated by block 352 of FIG. 5C and the gate status feedback signal is checked to verify that it is off, as illustrated by block 354. If there are any abnormalities indicated by a negative result at blocks 342, 346, 348, 350, or 354, an error message is generated, the fault flag is set, and the test sequence proceeds to the next step, as illustrated by blocks 356, 358, 360, 362, or 364. Processing continues until the fault flag test at block 368 where processing control branches to the end if the fault flag is set.

The next sequence of the auto self test begins, if no fault was previously detected, with the turn-on of the lower A phase GTO 34 by generation of an on command as illustrated by block 370. Referring to FIG. 4B, the phase A, phase B and phase C nodes 48, 48b, 48c were previously pulled to the positive DC line voltage by the previous turn-on of the upper GTO 32. Thus, when the lower A phase GTO 34 is turned on, pulling node 48 to the negative DC line voltage, the snubber current from the discharge of the phase A and phase C snubber capacitors flows through the phase A node 48 until the phase B and phase C nodes 48b and 48c are discharged to the negative DC line voltage. This results in the voltage versus time characteristics for $V_A$, $V_B$, and $V_C$ and for the current values $I_A$, $I_B$, and $I_C$, as illustrated in FIG. 4B. The on command for the lower A phase GTO 34 and off commands for all other GTOs are verified by checking the command signals, as shown by block 372. At blocks 374 and 376, the peak discharge current is then measured and checked against the reference, as described with regard to the previous sequence at blocks 344, 346. The three-phase voltages $V_A$, $V_B$, and $V_C$ are then sampled and verified to be low (i.e., approximately at the negative DC line voltage) as illustrated by block 378. The gate status feedback signals of all GTOs are then checked to verify that the lower A phase GTO 34 is on and all others are off as shown by block 380 (see FIG. 5D). The lower A phase GTO 34 off command is generated to turn off the GTO 34 and the gate status feedback for the GTO 34 is checked to be off as illustrated by blocks 382 and 384 of FIG. 5D. If the result of any of the tests at blocks 372, 376, 378, 380, or 384 are negative, an error message is generated, the fault flag is set, and the test sequence then proceeds normally as illustrated by blocks 386, 388, 390, 392, or 394. Processing then continues normally until the next fault flag test at block 398 where processing control branches to the end if the fault flag is set.

The test sequence next performs the test of phase B, if no fault was previously detected, with the upper B phase GTO turned on, as illustrated by block 400. This test sequence uses the same sequence as the phase A testing sequence for the top A phase GTO 32 turn-on, as illustrated by blocks 340 to 364. Thus, block 400 represents the same test sequence as blocks 340 to 364 with the exception that it is the upper B phase GTO on command that is generated and checked, and the $I_B$ (IMTRB) peak current made up of phase A and phase C snubber discharge currents which is measured and checked. Similarly, the test sequence is completed when the upper B phase GTO is turned off and the feedback is checked, as illustrated by block 402, after which the fault flag is checked at block 403 and, if set, program control branches to the end.

The next test sequence is performed, if no fault was detected, by turning the lower B phase GTO on, as illustrated by block 404. The test sequence represented by block 404 is the same as the test sequence for the lower A phase GTO turn-on test sequence illustrated by blocks 370–394, except that it is the lower B Phase GTO on command that is generated and checked, and it is the $I_B$ (IMTRB) peak current which is measured and checked. The test sequence for the lower B phase GTO is completed by turning off the lower B phase GTO and verifying the turn-off by checking the status feedback for the lower B phase GTO, as illustrated by block 406. The fault flag is then checked at block 407 and, if set, program control branches to the end of the routine.

An upper C phase GTO turn-on test sequence is next performed, if no fault was previously detected, as illustrated by block 408 using the same test sequence as that described for the turn-on of the upper A phase GTO 32 described at blocks 340 to 364. This test sequence varies from that for the upper A phase and upper B phase GTO turn-on test in that it is the upper C phase GTO on command that is generated and checked and it is $I_C$ (IMTRC) or the sum of $I_B$ (IMTRB) and $I_A$ (IMTRA) peak current which is measured and checked. The upper C phase GTO on test is terminated by turning off the GTO and verifying that it is off by checking the status feedback signal, as illustrated at block 410. The fault flag is then checked at block 411 and, if set, program control branches to the end of the routine. Next, the lower C phase GTO turn-on test sequence is performed if no fault was detected, as illustrated at block 412, which is substantially the same sequence as described for the lower A phase GTO as illustrated at blocks 370 to 394. The test sequence of block 412 differs from the test sequence for the lower A phase GTO 34 in that it is the lower C phase GTO on command that is generated and checked and it is the $I_C$ (IMTRC) or the sum of $I_A$ (IMTRA) and $I_B$ (IMTRB) peak current values which are measured and checked. The test sequence is ended by turning off the lower C phase GTO and verifying the status feedback signal to ensure that the GTO is turned off. The test sequence is thus completed, as illustrated by block 416.

Specific embodiments of the novel method and apparatus for auto self test of an AC motor system have been described for the purpose of illustrating the manner in which the invention may be made and used. It should be understood that implementation of other variations and modifications of the invention in its various aspects will be apparent to those skilled in the art and that the invention is not limited by specific embodiments described. It is therefore contemplated to cover by the present invention any and all modifications, variations or equivalents that fall within the true spirit and scope of the underlying principals disclosed and claimed herein.

What is claimed is:

1. An auto self test method, for testing a power converter system having at least one motor means, while the motor means is stopped, the motor means being operatively connected to the power converter system, the power converter having at least one leg, each leg having a first and second series connected control turn-off device wherein each device has a control electrode, the method comprising the steps of:
   selectively generating control signals for coupling to the control electrode of each device to individually render each device conductive such that transient current flows through the motor means and through the control turn-off device rendered conductive;
   measuring the transient current;
   comparing the transient current to a reference current; and
   generating an indication of defect in response to a substantial difference between the transient current and the reference current, and a power converter.

2. The method of claim 1 further comprising the steps of:
   detecting the control signals coupled to the control electrode of a selected control turn-off device and verifying that the control signals coupled to the electrode are identical to the control signals generated.

3. The method of claim 1 further comprising the steps of:
   detecting the state of conduction of a selected control turn-off device and comparing the detected state of the selected control turn-off device to the control signals coupled to the control electrode of the selected control turn-off device to detect failure of the control turn-off device to respond to the control signals.

4. The method of claim 1 further comprising the steps of:
   measuring a voltage in at least one leg of the power converter a period of time after measuring the transient current, and comparing the measured voltage to a reference voltage to detect defects in the power converter.

5. The method of claim 1 wherein the motor means is a three-phase motor and wherein the transient current flows through each phase of the motor.

6. An auto self testing system for a power converter system, the power converter system having a power converter and motor means, operatively connected thereto, without the risk of turning on the motor means during testing, wherein the power converter includes at least one leg, each leg having a first and second series connected control turn-off device each including a control electrode, the auto self testing system comprising:
   means for selectively generating control signals for coupling to the control electrode of each control turn-off device so as to individually render each control turn-off device conductive such that transient current flows through the motor means and the device rendered conductive;
   means for measuring the transient current operatively connected to the power converter; and
   means for comparing the transient current to a reference current and for generating an indication of detection of a defect and response to a substantial difference between the transient current and the reference current.

7. The system of claim 6 further comprising:
   means for detecting the control signals coupled to the control electrode of selected control turn-off devices; and
   means for verifying that the control signals coupled to the control electrode are identical to the control signals generated.

8. The system of claim 6 further comprising:
   means for detecting the state of conduction of selected control turn-off devices in the power converter; and
   means for comparing the detected state of the selected control turn-off devices to the control signals coupled to each respective control electrode of the selected control turn-off devices to detect failure of the control turn-off devices to respond the control signals.

9. The system of claim 6 further comprising:
   means for measuring a voltage in at least one leg of the power converter a period of time after the transient current is measured; and
   means for comprising the measured voltage to a reference voltage to detect defects in the power converter.

10. The system of claim 6 wherein each leg of the power converter comprises:
    a snubber circuit including a snubber capacitor in parallel with each control turn-off device.

11. The system of claim 6 wherein the means for measuring the transient current comprises:
    at least one current sensing circuit.

12. The system of claim 11 wherein the means for selectively generating comprises:
   a microprocessor for controlling generation of control signals.

13. The system of claim 6 wherein the motor means comprises an AC motor.

14. The system of claim 6 wherein the motor means comprises multiple AC motors in parallel.

15. The system of claim 13 wherein the motor comprises a three-phase motor and the transient current flows through each phase of the motor.

16. A system for auto self testing a power converter, including at least one motor means, operatively connected to the power converter, without the risk of rotating the motor means during the test, the power converter including at least one leg having a first and second series connected control turn-off device each including a control electrode, the system comprising:
   processor means, for controlling generation of control signals and for selectively generating the control signals for coupling to the control electrode of each control turn-off device so as to individually render each control turn-off device conductive such that transient current flows through the motor means and the device rendered conductive;
   means for measuring the transient current operatively connected to the power converter; and
   means for comparing the transient current to a reference current and for generating an indication of detection of a defect and response to a substantial difference between the transient current and the reference current.

17. The system of claim 16 wherein the processor means further comprises:
   means for detecting the control signals coupled to the control electrode of selected control turn-off devices; and
   means for verifying that the control signals coupled to the control electrode are identical to the control signals generated.

18. The system of claim 16 wherein the processor means further comprises:
   means for detecting the state of conduction of selected control turn-off devices in the power converter; and
   means for comparing the detected state of the selected control turn-off devices to the control signals coupled to each respective control electrode of the selected control turn-off devices to detect failure of the control turn-off devices to respond the control signals.

19. The system of claim 16 wherein the processor means further comprises:
   means for measuring a voltage in at least one leg of the power converter a period of time after the transient current is measured; and
   means for comparing the measure voltage to a reference voltage to detect defects in the power converter.

20. The system of claim 16 wherein each leg of the power converter includes a snubber circuit including a snubber capacitor in parallel with each control turn-off device.

* * * * *